(12) United States Patent
Hakuma et al.

(10) Patent No.: US 7,829,782 B2
(45) Date of Patent: Nov. 9, 2010

(54) PHOTOVOLTAIC CONVERSION DEVICE, OPTICAL POWER GENERATOR AND MANUFACTURING METHOD OF PHOTOVOLTAIC CONVERSION DEVICE

(75) Inventors: Hideki Hakuma, Shiga (JP); Kenichi Okada, Shiga (JP); Kenji Tomita, Shiga (JP); Hisao Arimune, Shiga (JP)

(73) Assignee: Kyocera Corporation, Kyoto (JP)

( * ) Notice: Subject to any disclaimer, the term of this patent is extended or adjusted under 35 U.S.C. 154(b) by 1166 days.

(21) Appl. No.: 11/113,813

(22) Filed: Apr. 25, 2005

(65) Prior Publication Data
US 2005/0247338 A1     Nov. 10, 2005

(30) Foreign Application Priority Data
Apr. 26, 2004   (JP) ............... 2004-129888

(51) Int. Cl.
*H01L 31/042* (2006.01)
(52) U.S. Cl. ............... 136/250; 136/243; 136/252; 136/261
(58) Field of Classification Search .......... 136/250
See application file for complete search history.

(56) References Cited

U.S. PATENT DOCUMENTS

| | | | | |
|---|---|---|---|---|
| 3,350,775 | A * | 11/1967 | Iles ............... | 438/98 |
| 6,420,647 | B1 * | 7/2002 | Ji et al. .......... | 136/259 |
| 6,664,567 | B2 * | 12/2003 | Kyoda et al. ..... | 257/53 |
| 2002/0162585 | A1 * | 11/2002 | Sugawara et al. .. | 136/250 |
| 2003/0178057 | A1 * | 9/2003 | Fujii et al. ..... | 136/256 |

FOREIGN PATENT DOCUMENTS

| JP | 2001-274439 | 10/2001 |
|---|---|---|
| JP | 2003318422 A | 11/2003 |

OTHER PUBLICATIONS

Sugawara Makoto, Kishu Atsuo, Setoguchi Akiko and Arimune Hisao, Photoelectric converter and method of manufacturing same, machine translation JP 2003 318422, Jul. 11, 2003.*
Japanese language office action and its English language translation for corresponding Japanese application 2004129888 lists the reference above.

* cited by examiner

*Primary Examiner*—Alexa D Neckel
*Assistant Examiner*—Miriam Berdichevsky
(74) *Attorney, Agent, or Firm*—DLA Piper LLP (US)

(57) ABSTRACT

To provide an easy-to-manufacture, high-quality photovoltaic conversion device and an optical power generator and also to provide a manufacturing method with high production efficiency.

To realize these, a photovoltaic conversion device is manufactured by a manufacturing method of a photovoltaic conversion device comprising steps of:

(1) joining a lot of semiconductor particles 10 to a substrate 1;
(2) forming a protective film 6 comprised of an oxide film, nitriding film, or oxynitriding film of a semiconductor constituting the semiconductor particle 10 on the surface of the semiconductor particle 10 except the junction where the semiconductor article 10 is joined to the substrate1;
(3) forming an insulator 4 in a lower part between the adjoining semiconductor particles 10 on the substrate 1;
(4) removing an upper part of the protective film 6 to allow an upper part of the semiconductor particle 10 to be exposed; and
(5) forming an upper electrode 5 on the surface of the exposed upper part (connection area S) of the semiconductor particle 10 and the surface of the insulator 4.

22 Claims, 8 Drawing Sheets

PHOTOVOLTAIC CONVERSION DEVICE, OPTICAL POWER GENERATOR AND MANUFACTURING METHOD OF PHOTOVOLTAIC CONVERSION DEVICE

BACKGROUND OF THE INVENTION

1. Field of the Invention

The present invention relates to a photovoltaic conversion device which is easy to manufacture and has high photovoltaic conversion efficiency, an optical power generator and a manufacturing method of the photovoltaic conversion device.

2. Description of Related Art

A photovoltaic conversion device such as a solar cell and an optical sensor serves to transform optical energy such as sunlight incident on its surface into electric energy. In this photovoltaic conversion device, it is considered that its photovoltaic conversion efficiency is improved by reducing loss of incident light and generated photocurrent.

Especially to reduce loss of photocurrent, it is effective to reduce recombination of carrier on a surface of a semiconductor for performing photovoltaic conversion by forming a protective film on the surface of the semiconductor (Refer to "Fundamental and Application of Thin Film Solar Cell", the 1st edition, written and edited by Makoto Konagai, OhmSha, Ltd., Mar. 20, 2001, pp. 53 to 55).

Since only a small amount of semiconductor as a material is used, the photovoltaic conversion device using a semiconductor particle among photovoltaic conversion devices has attracted much attention in recent years.

For example, as the photovoltaic conversion device in which a protective film is formed on the semiconductor particle, there is proposed a micro photovoltaic cell in which a cathode and an anode are each formed at a bottom part and a top part, respectively, of a spherical semiconductor device on which a protective film of silicon oxide is formed, both parts being opposed to each other across the center of the semiconductor device (Refer to Unexamined Patent Publication No. 2001-274439).

Generally, in the photovoltaic conversion device using the semiconductor particle, since an individual photovoltaic conversion device generates only a small amount of electric power, a lot of photovoltaic conversion devices are joined to a substrate or the like and the cathode/anode of one photovoltaic conversion device is the anode/cathode of another photovoltaic conversion device through a conductor to generate a large amount of electric power.

However, when a lot of micro photovoltaic cells are joined to the substrate or the like, electrodes of the micro photovoltaic cells must be neatly aligned. Accordingly, to use the above-mentioned micro photovoltaic cell, there is a disadvantage that manufacturing is difficult and production efficiency is low.

To form the cathode and the anode in the above-mentioned micro photovoltaic cell, it is necessary to mask each of the semiconductor particles with a corrosion-resistant photosensitive resin film and form a contact hole for cathode and a contact hole for anode. When such spherical semiconductor particle is masked, a complicated process is required. For this reason, the production efficiency is remarkably low and the high-quality of the micro photovoltaic cell thus obtained is hard to be maintained.

An object of the present invention is to provide an easy-to-manufacture, high-quality photovoltaic conversion device and an optical power generator and also to provide a manufacturing method of the photovoltaic conversion device with high production efficiency.

SUMMARY OF THE INVENTION

A photovoltaic conversion device of the present invention is characterized by comprising a substrate used as a lower electrode; a lot of semiconductor particles joined to the substrate; an insulator formed in a lower part between the adjoining semiconductor particles on the substrate; a protective film comprised of an oxide, nitride, or oxynitride of the semiconductor constituting the semiconductor particle, which is formed on the surface of the semiconductor particle except at least a part of the surface thereof; and an upper electrode formed on the surface of the insulator and on an area of the part of the surface of the semiconductor particle on which the protective film is not formed, said area being a connection area with the upper electrode and the semiconductor particle.

According to the photovoltaic conversion device of the present invention, since the protective film is formed on the surface of the upper part of semiconductor particle except a part thereof along the semiconductor particle, recombination of the career generated in the semiconductor particle is prevented efficiently.

Therefore, the photovoltaic conversion device with high photovoltaic conversion efficiency can be obtained. Since the upper electrode is formed at the connection area of the semiconductor particle and the surface of the insulator, the spherical semiconductor and the upper electrode are connected electrically and the carrier generated in the upper part of the semiconductor particle is certainly moved to the upper electrode. Accordingly, since the career moving through the semiconductor particle does not receive a large resistance during the movement, the photovoltaic conversion device with high photovoltaic conversion efficiency can be obtained.

It is preferred that the protective film exists above the formation region of the insulator on the surface of the semiconductor particle and the upper electrode is formed also on the surface of the upper part of the protective film.

With this configuration, since the upper electrode is formed also on the surface of the upper part of the protective film, the career in the semiconductor particle is certainly moved from the periphery of the upper part of the protective film to the upper electrode. Therefore, the photovoltaic conversion device with high photovoltaic conversion efficiency can be obtained.

It is preferred that the semiconductor particle has a one conduction-type semiconductor part joined to the substrate and an other conduction-type semiconductor layer formed on the surface of the one conduction-type semiconductor part and a lower end of the other conduction-type semiconductor layer is coated with the protective film.

With this configuration, since the lower end of the other conduction-type semiconductor layer is coated with the protective film, the lower end of the other conduction-type semiconductor layer is electrically separated from the substrate and the carrier generated in the semiconductor layer is certainly moved to the upper electrode without being transferred to the substrate. Therefore, the photovoltaic conversion device with high photovoltaic conversion efficiency can be obtained.

It is preferred that the substrate is formed of silver, aluminum or copper.

With this configuration, since the substrate is formed of silver, aluminum or copper, more light reflected from the substrate is led to the pn junction of the semiconductor particle. Therefore, the photovoltaic conversion device with high photovoltaic conversion efficiency can be obtained.

It is preferred that the substrate contains an impurity element which is incorporated from the one conduction-type semiconductor joined to the substrate.

With this configuration, since the substrate contains an impurity element which imparts one conduction type, a high-concentration semiconductor layer is easy to be formed at the junction joined to a substrate. Therefore, the photovoltaic conversion device with high photovoltaic conversion efficiency can be obtained.

It is preferred that the semiconductor particle has a rough surface.

With this configuration, since the semiconductor particle has a rough surface, reflection of incident light on the surface of the semiconductor particle is suppressed. Therefore, the photovoltaic conversion device with high photovoltaic conversion efficiency can be obtained.

It is preferred that a high-concentration semiconductor layer containing an impurity element which imparts one conduction type to the semiconductor joined to the substrate in higher concentration than the one formed in the bulk of the semiconductor particle.

With this configuration, since the high-concentration semiconductor layer serves as a potential barrier for the carrier, the carrier generated in the semiconductor particle is turned back by the potential barrier. Therefore, since recombination of the carrier is prevented, the photovoltaic conversion device with high photovoltaic conversion efficiency can be obtained.

It is preferred that an average value of the thickness of the protective film is 1 nm to 100 nm.

With this configuration, recombination of the carrier generated in the semiconductor particle is prevented efficiently. Therefore, the photovoltaic conversion device with high photovoltaic conversion efficiency can be obtained.

It is preferred that the protective film contains hydrogen.

A lot of dangling bonds (uncombined hands) exist on the surface of the semiconductor particle.

However, with this configuration, since the protective film contains hydrogen, the dangling bonds on the surface of the semiconductor particle are extinguished by hydrogen. Therefore, since recombination of the carrier is prevented, the photovoltaic conversion device with high photovoltaic conversion efficiency can be obtained.

It is preferred that a ratio of the connection area to the surface area of the semiconductor particle except the junction where the semiconductor particle is joined to the substrate is 5% to 70%.

With this configuration, recombination of the carrier generated in the semiconductor particle is prevented efficiently. Therefore, the photovoltaic conversion device with high photovoltaic conversion efficiency can be obtained.

An optical power generator of the present invention is so configured as to use the photovoltaic conversion device as a power generating means which supplies generated electric power to a load.

Since the optical power generator of the present invention uses the photovoltaic conversion device having high photovoltaic conversion efficiency, optical power generation with high photovoltaic conversion efficiency can be performed.

A manufacturing method of a photovoltaic conversion device of the present invention is characterized by comprising steps of:

(1) joining a lot of semiconductor particles to a substrate used as a lower electrode;

(2) forming a protective film comprised of an oxide, nitride, or oxynitride of the semiconductor constituting the semiconductor particle on the surface of the semiconductor particle except the junction where the semiconductor particle is joined to the substrate;

(3) forming an insulator in a lower part between the adjoining semiconductor particles on the substrate;

(4) removing a part of the protective film to allow an upper part of the semiconductor particle to be exposed; and (5) forming an upper electrode on the surface of the insulator, and on the surface of the exposed part of the semiconductor particle.

According to the manufacturing method of the photovoltaic conversion device, the protective film is formed certainly and easily. Therefore, the high-quality photovoltaic conversion device can be manufactured while maintaining high production efficiency.

It is preferred that in the step (2) of forming the protective film, the protective film is formed by using the thermal oxidation method at temperatures not higher than a melting point of the junction where the semiconductor particle is joined to the substrate.

According to the thermal oxidation method, the protective film can be uniformly formed on the whole surface of the semiconductor particle while maintaining the quality of pn junction of the semiconductor particle. Therefore, the high-quality photovoltaic conversion device with high photovoltaic conversion efficiency can be obtained.

It is preferred that the protective film is formed in an oxygen atmosphere, a steam atmosphere or an atmosphere in which both oxygen and steam exist.

By forming the protective film in this manner, the protective film is formed at a fast deposition rate so as not to cause a defect easily. Therefore, the high-quality photovoltaic conversion device can be manufactured while maintaining high production efficiency.

It is preferred that the formed protective film is heated in an atmosphere containing hydrogen.

A lot of dangling bonds (uncombined hands) exist on the surface of the semiconductor particle.

However, due to the heat treatment, the protective film contains hydrogen. Accordingly, the dangling bonds on the surface of the semiconductor particle are extinguished by hydrogen. Therefore, since recombination of the carrier is prevented, the photovoltaic conversion device with high photovoltaic conversion efficiency can be obtained.

A manufacturing method of the photovoltaic conversion device of the present invention is characterized by comprising steps of:

(1) joining a lot of semiconductor particles to a substrate used as a lower electrode;

(2) forming a resist at least an upper part of the semiconductor particle;

(3) forming a protective film which covers the surface of the semiconductor particle except the junction where the semiconductor article is joined to the substrate, the protective film being composed of an oxide, nitride, or oxynitride of the semiconductor constituting the semiconductor particle;

(4) forming an insulator in a lower part between the adjoining semiconductor particles on the substrate;

(5) removing the resist to allow the upper part of the surface of the semiconductor particle to be exposed; and (6) forming an upper electrode on the surface of the exposed upper part of the semiconductor particle, the surface of the upper part of the protective film and the surface of the insulator.

According to the manufacturing method of the photovoltaic conversion device, the protective film is covered with the semiconductor particle except the area covered with the upper electrode. Therefore, the photovoltaic conversion device with high photovoltaic conversion efficiency can be manufactured easily.

It is preferred that a step of etching the surface of the semiconductor particle except the junction and the area where the resist is formed is included following the step (2) of forming the resist.

A short circuit between the upper electrode and the substrate may occur through the pn junction on the surface of the semiconductor particle except the junction and the area where the resist is formed.

However, since the step of etching the surface is further included, the pn junction of the surface is removed, thereby to prevent a short-circuit between the upper electrode and the substrate. Therefore, the photovoltaic conversion device with high photovoltaic conversion efficiency can be manufactured.

It is preferred that in the step (3) of forming the protective film, the protective film is formed by using the thermal oxidation method at temperatures not higher than a melting point of the junction where the semiconductor particle is joined to the substrate. The protective film may be formed by other thin film manufacturing method, such as CVD method or DIP method.

According to the thermal oxidation method, the protective film can be uniformly formed on the whole surface of the semiconductor particle while maintaining the quality of pn junction of the semiconductor particle. Therefore, the photovoltaic conversion device with high photovoltaic conversion efficiency can be manufactured.

It is preferred that the protective film is formed in an oxygen atmosphere, a steam atmosphere or an atmosphere in which both oxygen and steam exist.

By forming such a protective film, the protective film is formed at a fast deposition rate so as not to cause a defect easily. Therefore, the high-quality photovoltaic conversion device can be manufactured while maintaining high production efficiency.

It is preferred that the formed protective film is heated in an atmosphere containing hydrogen.

A lot of dangling bonds (uncombined hands) exist on the surface of the semiconductor particle.

However, with this configuration, the protective film contains hydrogen. Accordingly, the dangling bonds on the surface of the semiconductor particle are extinguished by hydrogen. Therefore, since recombination of the carrier is prevented, the photovoltaic conversion device with high photovoltaic conversion efficiency can be obtained.

The above-mentioned and other advantages, features and effects will appear more fully hereinafter from a consideration of the following description with reference to the accompanying drawings.

DETAILED DESCRIPTION OF PREFERRED EMBODIMENTS

An embodiment of a photovoltaic conversion device will be described in detail with reference to FIGS. 1a and 1b.

Figure 1A:
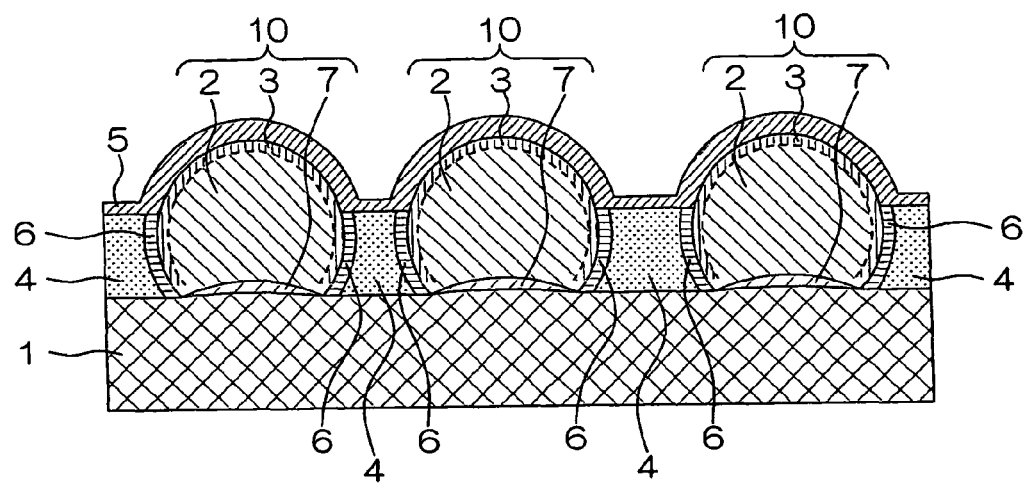
FIGS. 1a and 1b and FIGS. 2a and 2b are expanded sectional views showing an embodiment of a photovoltaic conversion device.

FIG. 1a is an enlarged sectional view of the photovoltaic conversion device in this embodiment. FIG. 1b is a further enlarged sectional view of the photovoltaic conversion device shown in FIG. 1a.

FIG. 1a shows a substrate 1 used as a lower electrode, a one conduction-type (for example, p-type) semiconductor part 2 forming a semiconductor particle, an other conduction-type (for example, n-type) semiconductor layer 3 formed on the semiconductor particle 10, an insulator 4, an upper electrode 5, a protective film 6 and a high-concentration semiconductor layer 7.

This photovoltaic conversion device has the substrate 1, a lot of semiconductor particles 10 joined to the substrate 1, the insulator 4 formed on the substrate 1 in a lower part between the adjoining semiconductor particles 10, the protective film 6 formed on the surface of an upper hemisphere of the semiconductor particle 10 and the upper electrode 5 formed on the surface of the upper hemisphere of the semiconductor particle 10 and the surface of the insulator 4.

Metal, glass, ceramics or resin is used as a material for the substrate 1. Preferably, a high reflective metal having high reflectance, such as silver (Ag), aluminum (Al) and copper (Cu) is used. By using the substrate 1, more light reflected from the substrate 1 is led to pn junctions of the semiconductor particles 10. Therefore, the photovoltaic conversion device with high photovoltaic conversion efficiency can be obtained.

An insulator material can be also used as the material for the substrate 1. In this case, it is necessary to independently form a conductive layer used as a lower electrode on the surface of the substrate 1. As a material for the conductive layer, high reflective metal such as silver, aluminum or copper is used. By using such a conductive layer, more light reflected from the substrate 1 is led to the pn junctions of the semiconductor particles 10. Therefore, the photovoltaic conversion device with high photovoltaic conversion efficiency can be obtained.

Further, it is preferred that the substrate 1 includes an impurity element. When a one conduction-type semiconductor part 2 mentioned later is of the p-type conduction type, p-type impurity elements such as aluminum and boron (B) are used as such impurity elements.

The semiconductor particle 10 performs photovoltaic conversion. The semiconductor particle 10 is comprised of silicon, germanium or the like. The semiconductor particle 10 further includes aluminum, boron and antimony (Sb) as a p-type impurity element, or phosphorus (P) and arsenic (As) as an n-type impurities element. The semiconductor particle 10 may be either monocrystal or polycrystal. Preferably, the semiconductor particle 10 is monocrystal to improve photovoltaic conversion efficiency.

The semiconductor particle 10 has the one conduction-type semiconductor part 2 joined to the substrate 1 and the other conduction-type semiconductor layer 3 formed on the surface of the one conduction-type semiconductor part 2.

When the one conduction-type semiconductor part 2 is of the p-type conduction type, it contains aluminum, boron or antimony as the p-type impurity element. When the one conduction-type semiconductor part 2 is of n-type conduction type, it contains phosphorus, arsenic or the like as the n-type impurity element. More specifically, when the one conduction-type semiconductor part 2 is of p-type conduction type, it contains the p-type impurity element (boron, aluminum) in the concentration of $1 \times 10^{14}$ to $1 \times 10^{18}$ atoms/cm$^3$.

The other conduction-type semiconductor layer 3 contains the impurity element that imparts thereto the conduction type opposite to one conduction type imparted by the impurity element to the one conduction-type semiconductor part 2. That is, when the one conduction-type semiconductor part 2 is of p-type conduction type, the other conduction-type semiconductor layer 3 contains phosphorus, arsenic or the like as the n-type impurity element, and when the one conduction-type semiconductor part 2 is of n-type conduction type, the other conduction-type semiconductor layer 3 contains aluminum, boron or antimony as the p-type impurity element. More specifically, the concentration of the impurity element of the other conduction-type semiconductor layer 3 is $1 \times 10^{16}$ atoms/cm$^3$ to $5 \times 10^{20}$ atoms/cm$^3$, preferably, and $1 \times 10^{16}$ atoms/cm$^3$ to $5 \times 10^{19}$ atoms/cm$^3$, more preferably. When the concentration of the impurity element of the other conduction-type semiconductor layer 3 has the concentration of $1 \times 10^{16}$ atoms/cm$^3$ to $5 \times 10^{20}$ atoms/cm$^3$, it is possible to obtain sufficient diffusion potential when forming the pn junction of the semiconductor particle 10 and prevent many interface levels from being formed due to excessive high concentration of the impurity element of the other conduction-type semiconductor layer 3.

The high-concentration semiconductor layer 7 is formed on a junction where the semiconductor particle 10 is joined to the substrate 1 and contains the impurity element contained in the one conduction-type semiconductor part 2 in higher concentration than the one conduction-type semiconductor part 2. More specifically, when the one conduction-type semiconductor part 2 contains aluminum as the impurity element, it is preferred that the high-concentration semiconductor layer 7 has the concentration of aluminum of about $1 \times 10^{18}$ to $1 \times 10^{20}$ atoms/cm$^3$. This high-concentration semiconductor layer 7 has the BSF (Back Surface Field) effect.

Preferably, the protective film 6 is formed of an insulation material such as an oxide film, nitride film or oxynitride film of the semiconductor constituting the semiconductor particle 10. When the element constituting the semiconductor particle 10 is silicon, silicon oxide, silicon nitride and the like are preferably used.

The insulator 4 is formed of an insulation material for electrically insulating the substrate 1 from the upper electrode 5. For example, (1) glass material using any constituent selected from SiO$_2$, B$_2$O$_3$, Al$_2$O$_3$, BaO and the like as a main constituent, (2) resin material such as epoxy resin and polyimide resin and (3) inorganic and organic composite materials may be employed. Preferably, polyimide resin is used.

The insulator 4 is formed in the lower part between the adjoining semiconductor particles 10 on the substrate 1.

The material which does not absorb light such as ITO, zinc oxide and tin oxide is used for the material for the upper electrode 5. More specifically, the above-mentioned material has the high optical transmittance in the wavelength of 400 nm to 1200 nm. The material with high optical transmittance refers to the material having the light transmittance of 70% or more, for example.

The upper electrode 5 is formed on the surface of the upper hemisphere of the semiconductor particle 10 and the surface of insulator 4 (FIG. 1a). The upper electrode 5 is formed of ITO, a zinc oxide, tin oxide or the like by using the sputtering method, the CVD method, etc. The upper electrode 5 can attain antireflection effect by adjusting its thickness and refractive index. An auxiliary electrode of a suitable pattern may be formed on the upper electrode 5 using a silver or copper paste.

Figure 1B:
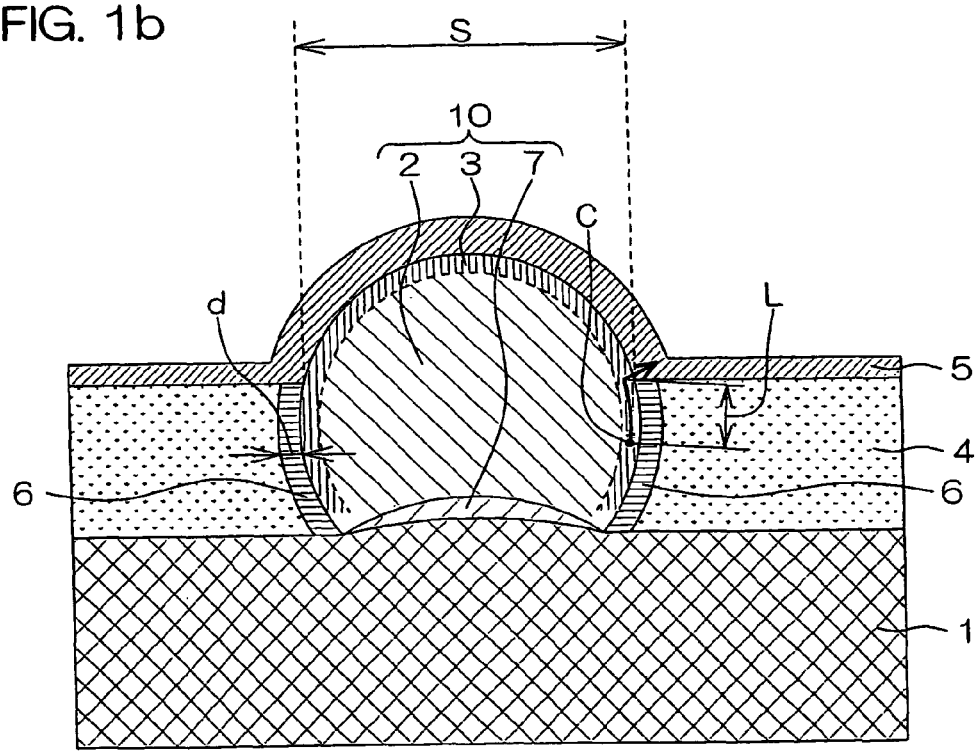

In FIGS. 1a and 1b, the substrate 1 is formed in the lower part of the photovoltaic conversion device. The semiconductor particles 10, the protective film 6, and the insulator 4 are formed above the substrate 1.

A lot of semiconductor particles 10 are joined on the substrate 1. The semiconductor particle 10 is substantially spherical and its lower part is joined to the substrate 1.

It is preferred that the semiconductor particle 10 has a rough surface. Due to the rough surface, incident light can be prevented from reflecting on the surface of the semiconductor particle 10. The dry etching method by RIE (Reactive Ion Etching), the selection wet etching method by sodium hydroxide, the sandblast method or the like is used as the method of making the surface of the semiconductor particle 10 rough. The junction of the semiconductor particle 10 only needs to achieve secure joint between the semiconductor particle 10 and the substrate 1 and preferably, has the smallest possible surface area. The high-concentration semiconductor layer 7 is formed on the junction of the semiconductor particle 10.

The other conduction-type semiconductor layer 3 is formed on the surface of the semiconductor particle 10 except the junction. The other conduction-type semiconductor layer 3 is formed so that its lower end is close to the junction of the lower half of the one conduction-type semiconductor part 2 with the substrate 1. When the other conduction-type semiconductor layer 3 is formed as mentioned above, light which penetrates through the insulator 4 can be reflected on the substrate 1 and irradiated to the pn junction in the lower part of the semiconductor particle 10, thereby to obtain the photovoltaic conversion device with high photovoltaic conversion efficiency. The other conduction-type semiconductor layer 3 is electrically connected to the upper electrode 5 through the surface on which the protective film 6 is not formed (hereinafter referred to as a connection area S) (Refer to FIG. 1b).

The high-concentration semiconductor layer 7 is formed on the junction of the semiconductor particle 10 and the substrate 1. Since the high-concentration semiconductor layer 7 is formed in this manner, this high-concentration semiconductor layer 7 serves as a potential barrier for a carrier C. For this reason, the carrier C generated in the semiconductor particle 10 is turned back by the potential barrier. Therefore, since recombination of the carrier C is prevented, the photovoltaic conversion device with high photovoltaic conversion efficiency can be obtained.

To form the high-concentration semiconductor layer 7, for example, the semiconductor particle 10 is joined to the substrate 1 formed of aluminum, and at the same time, the aluminum component in the substrate 1 is diffused into the junction of the semiconductor particle 10.

The protective film 6 is formed above the substrate 1 and between the semiconductor particle 10 and the insulator 4. Thus, the semiconductor particle 10 has the connection area S directly connected to the upper electrode 5 (Refer to FIG. 1b).

The configuration in which the protective film 6 is formed on the formation region of the insulator 4 and the protective film 6 is not directly covered with the upper electrode 5 has been described.

Figure 2A:
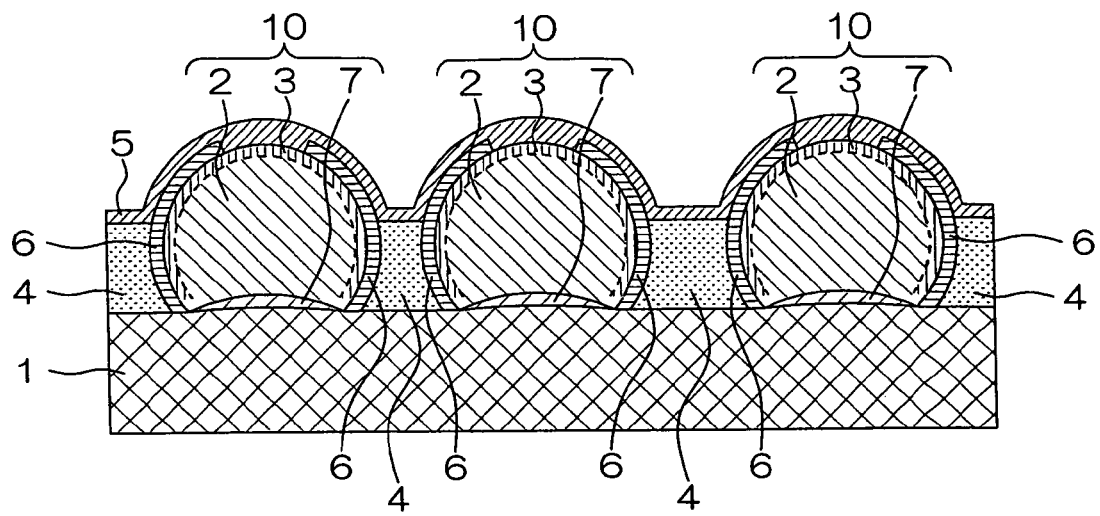
Figure 2B:
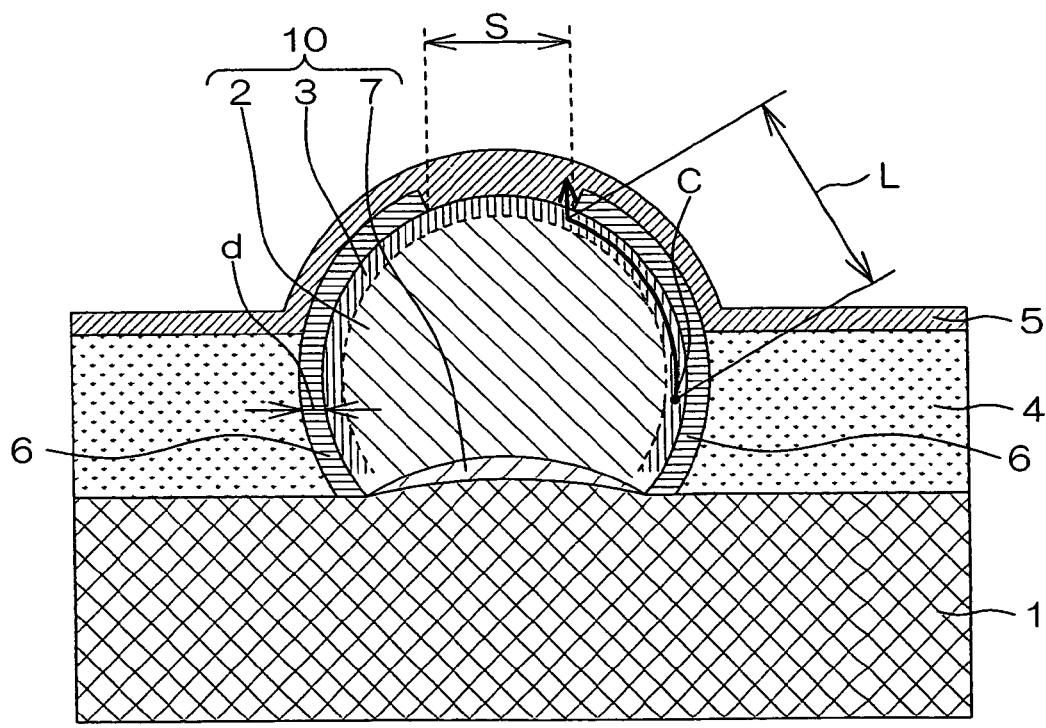

However, the photovoltaic conversion device may be constituted as shown in FIG. 2a and FIG. 2b.

FIGS. 2a and 2b are different from FIGS. 1a and 1b in that the protective film 6 exists above the formation region of the insulator 4 and the upper electrode 5 is formed also on the surface of the upper part of the protective film 6. That is, as shown in FIG. 2b, the protective film 6 is formed above the substrate 1 between the semiconductor particle 10 and the insulator 4 as well as above the insulator 4 between the semiconductor particle 10 and the upper electrode 5. In this case, the protective film 6 is formed so that its lower end is located near the junction with the substrate 1, its middle part runs along the surface of the upper hemisphere of the semiconductor particle 10, and its upper end is located in the middle of the surface of the upper hemisphere of the semiconductor particle 10.

As shown in FIGS. 2a and 2b, since the upper electrode 5 is formed also on the surface of the connection area S of protective film 6, the carrier C in the other conduction-type semiconductor layer 3 can be certainly moved to the upper electrode 5. Therefore, the photovoltaic conversion device with high photovoltaic conversion efficiency can be obtained.

The surface area of the connection area S in the configuration shown in FIGS. 1a and 1b and FIGS. 2a and 2b will be described below.

It is preferred that a ratio E of the surface area of the connection area S to the remaining surface area is set at 5% to 70%. The ratio E of the surface area of the connection area S is represented in the following formula.

$$E\ (\%) = (\text{Surface area of connection area } S) \times 100 / \{(\text{Surface area of semiconductor particle } 10) - (\text{Surface area of junction})\} \quad (1)$$

When the ratio E of the surface area of the connection area S is 5% to 70%, the semiconductor particle 10 is electrically connected to the upper electrode 5 through the connection area S. Therefore, the carrier C generated within the semiconductor particle 10 can be efficiently led to the upper electrode 5, and recombination of the carrier C in the semiconductor particle 10 can be also suppressed.

When the ratio E of the surface area of the connection area S is smaller than 5%, the carrier C generated at the place remote from the connection area S is moved to the upper electrode 5, and the moving path L becomes longer (Refer to FIG. 2b, for example), thereby to increase resistance. In addition, resistance becomes larger due to concentration of the carriers C in the connection area S.

When the ratio E of the surface area of the connection area S is larger than 70%, the moving path L becomes shorter (refer to FIG. 1b, for example) and the surface area of the protective film 6 becomes smaller, thereby to weaken the effect of suppressing recombination of the carrier C in the semiconductor particle 10.

Preferably, an average value of a thickness d of the protective film 6 is 1 nm to 100 nm (Refer to FIG. 1b and FIG. 2b). When the thickness d of the protective film 6 is smaller than 1 nm, the protective film 6 is shaped like an island and the area where the protective film 6 is not coated occurs on the semiconductor particle 10. For this reason, recombination of the career C on the surface of the semiconductor particle 10 cannot be sufficiently suppressed. On the other hand, when the thickness d of the protective film 6 is larger than 100 nm, light absorption in the protective film 6 becomes larger and the quantity of the light led to the pn junction of the semiconductor particle 10 decreases. Further, formation of the protective film 6 takes time, leading to a decrease in production efficiency. Furthermore, since stress on the semiconductor particle 10 and the substrate 1 becomes larger, a crack occurs in the substrate 1.

Next, a manufacturing method of the photovoltaic conversion device shown in FIGS. 1a and 1b will be described with reference to FIGS. 5a to 5f.

FIGS. 5a to 5f are sectional views of a process of the manufacturing method of the photovoltaic conversion device shown in FIGS. 1a and 1b.

Firstly, a lot of one conduction-type semiconductor parts 2 forming the semiconductor particles 10 are prepared. The one conduction-type semiconductor part 2 is formed by using the vapor growth method, atomizing method, direct current plasma method, phase growth, melt drop method, or the like. It is preferred that one conduction-type semiconductor part 2 is formed by using the melt drop method. Such forming method realizes high production efficiency and low costs. The melt drop method is a forming method of dropping a melt in non-contact environment.

Figure 5A:
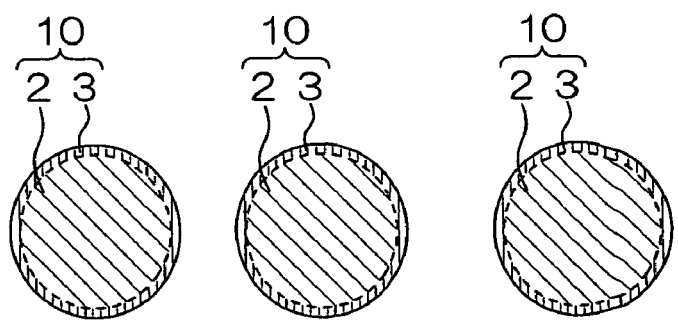
FIGS. 5a to 5f are sectional views each showing a process of a manufacturing method of the photovoltaic conversion device shown in FIGS. 1a and 1b.

Subsequently, as shown in FIG. 5a, the other conduction-type semiconductor layer 3 is formed on the surface of the one conduction-type semiconductor part 2. The other conduction-type semiconductor layer 3 is formed by using a thin film forming method such as the CVD method and sputtering method. Following doping (ion implantation) of the impurity element of the opposite conduction type to the one conduction-type semiconductor part 2 into the one conduction-type semiconductor part 2, the other conduction-type semiconductor layer 3 may be formed by using the thermal diffusion method. It is preferred that the other conduction-type semiconductor layer 3 is formed by using the thermal diffusion method.

Like the thin film forming method, since the thermal diffusion method requires no vacuum device, high production efficiency can be achieved and the other conduction-type semiconductor layer 3 can be uniformly formed all over the surface of the one-conduction-type semiconductor part 2. By forming the other conduction-type semiconductor layer 3, pn junction is formed between the one conduction-type semiconductor part 2 and the other conduction-type semiconductor layer 3.

Then, the semiconductor particles 10 are joined to the substrate 1. According to this method, the pn junction can be formed also in the lower part of the semiconductor particle 10.

Alternatively, the other conduction-type semiconductor layer 3 may be formed on the surface of the one conduction-type semiconductor part 2 before or after joining the one conduction-type semiconductor part 2 to the substrate 1. Preferably, after joining the one conduction-type semiconductor part 2 to the substrate 1, the other conduction-type semiconductor layer 3 is formed.

Figure 5B:
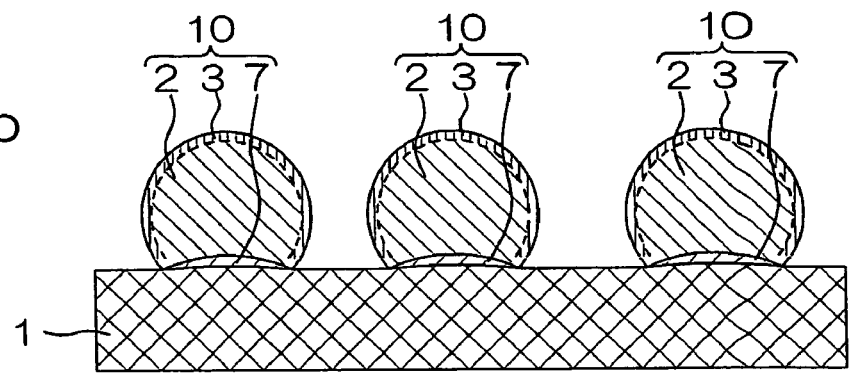

Subsequently, as shown in FIG. 5b, a lot of semiconductor particles 10 are joined to the substrate 1. To join the semiconductor particles 10 to the substrate 1, firstly, a lot of the semiconductor particles 10 are densely arranged in one layer, the substrate 1 and the one-conduction type semiconductor parts 2 are entirely heated, and the semiconductor particles 10 are joined to the substrate 1. In this way, the semiconductor particle 10 is joined to the substrate 1 through the junction with the substrate 1. In this case, in the junction of the semiconductor particle 10, the other conduction-type semiconductor layer 3 is removed. Accordingly, the carrier C generated in the pn junction of the semiconductor particle 10 can be taken out from the substrate 1.

Here, when the impurity element which imparts p-type conduction type to the one conduction type semiconductor part 2 is added to the substrate 1, the high-concentration semiconductor layer 7 containing the higher concentration of the p-type conduction type of impurity element than that of the one conduction-type semiconductor part 2 is formed at the junction.

In this case, the substrate 1 containing the impurity element imparting the conduction type to the one conduction-type semiconductor part 2 is used. By using the substrate 1, when the semiconductor particle 10 is joined to the substrate 1, the impurity element in the substrate 1 is diffused into the one conduction-type semiconductor part 2. Accordingly, the high-concentration semiconductor layer 7 is easy to be formed at the junction where the semiconductor particle 10 is joined to the substrate 1.

Figure 5C:
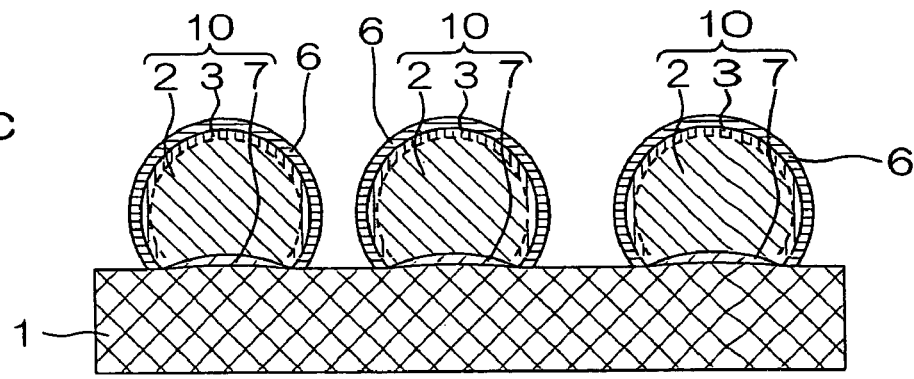

Subsequently, as shown in FIG. 5c, the protective film 6 is formed on the surface of the semiconductor particle 10 except the junction where the semiconductor particle 10 is joined to the substrate 1.

The protective film 6 may be formed by using the thermal oxidation method in low temperatures in which heat treatment is performed at a temperature below the melting point of a junction, and may be formed by using a thin film manufacturing method such as a CVD method.

Preferably, the protective film 6 is formed according to the thermal oxidation method in low temperatures. Specifically, heat treatment at temperatures not higher than the melting point of the junction is performed. According to the thermal oxidation method, the protective film 6 can be uniformly formed on the surface of the semiconductor particle 10 while maintaining the quality of the pn junction.

In this case, the protective film 6 is formed preferably in an atmosphere of oxygen, in an atmosphere of steam, or an atmosphere in which both oxygen and steam exist. By forming the protective film 6 according to the thermal oxidation method, the protective film 6 is formed at a fast deposition rate so as not to cause a defect easily. Therefore, the high-quality photovoltaic conversion device can be manufactured while maintaining high production efficiency.

The protective film 6 is formed following formation of the pn junction of the semiconductor particle 10. Therefore, the pn junction can be formed also in the lower part of the semiconductor particle 10, and the surface area of the pn junction can be increased.

According to the thermal oxidation method, when the protective film 6 is formed by thermal oxidation of the semiconductor particle 10, the deposition rate is increased in proportion to the heat treatment temperature. However, after the junction is formed, heat treatment needs to be performed at temperatures not higher than the melting point of the junction. More specifically, in a case where the substrate 1 formed of aluminum and the semiconductor particles 10 formed of silicon are used, when they are heated and joined to each other, an alloy layer of aluminum and silicon is formed at the junction. The eutectic temperature of aluminum and silicon is 577° C.

Then, preferably, heat treatment is performed at temperatures lower than the eutectic temperature of aluminum and silicon. This heat treatment can prevent influence on the junction without lowering the quality of the pn junction of the semiconductor particles 10.

In this case, it is preferred to form the protective film 6 in an atmosphere of oxygen, in an atmosphere of steam, or an atmosphere in which both oxygen and steam exist. When the protective film 6 is formed in such an atmosphere, the protective film 6 can be formed also in heat treatment at temperatures not higher than the eutectic temperature of aluminum and silicon while maintaining high production efficiency.

For example, an oxide film is formed stably in an atmosphere containing oxygen gas. Therefore, the high-quality protective film 6 which is difficult to cause a defect can be formed.

Since the deposition rate is increased in an atmosphere containing steam, the protective film 6 can be formed at lower temperatures than before while maintaining high production efficiency.

In an atmosphere containing oxygen gas and steam, the high-quality protective film 6 can be formed even at low temperatures while maintaining high production efficiency. The mixing ratio of oxygen gas and steam is set as a proper ratio in consideration of the quality and manufacturing efficiency of the protective film 6.

It is preferred that the protective film 6 is formed and the protective film 6 is subjected to heat treatment in an atmosphere containing hydrogen. By the heat treatment, the protective film 6 containing hydrogen can be formed.

Generally, a lot of dangling bonds (uncombined hands) exist on the surface of the semiconductor particle 10. However, by forming the protective film 6 containing hydrogen, the dangling bonds on the surface of the semiconductor particle 10 can be extinguished (terminated) through hydrogen. Accordingly, since recombination of the carrier C is prevented, the photovoltaic conversion device with high photovoltaic conversion efficiency can be obtained.

Recombination of the carrier C generated in the semiconductor particle 10 can be prevented efficiently by forming the protective film 6, and the carrier C generated in the upper part of the semiconductor particle 10 can be certainly moved to the upper electrode 5.

Figure 5D:
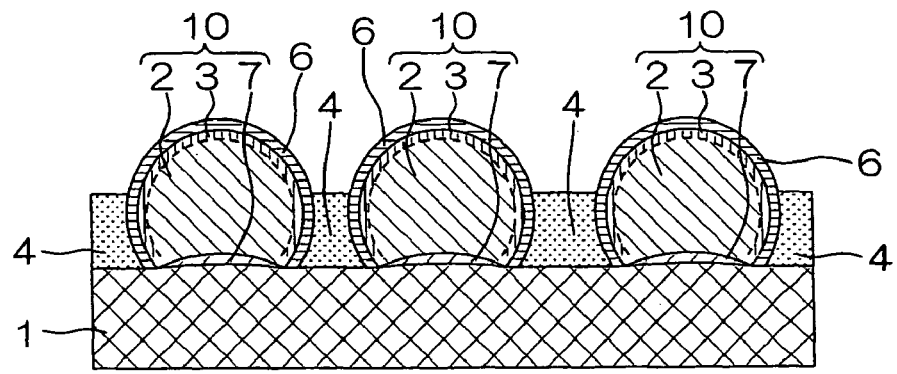

Next, as shown in FIG. 5d, the insulator 4 is formed in the lower part between the adjoining semiconductor particles 10. To form the insulator 4, the insulator 4 formed of an acid-proof insulating material is firstly prepared. Subsequently, the insulator 4 is formed so as to fill between the adjoining semiconductor particles 10. The insulator 4 is formed by using the dipping method, the spin coat method, the spray method, the screen printing method, the method of using capillarity or the like. In the method of using capillarity, an insulator forming solution is supplied to the substrate 1 and the supplied insulator forming solution is automatically moved by utilizing capillarity so as to fill gaps between a lot of semiconductor particles 10 on the substrate 1. After filling the solution on the substrate 1 and the gaps between a lot of semiconductor particles 10, heat treatment is performed for hardening.

Thus, the insulator 4 is formed in the lower part between the adjoining semiconductor particles 10. The protective film 6 located in the upper part of the semiconductor particle 10 is not covered by the insulator 4. At this time, the protective film 6 arranged above the formation region of the insulator 4 is still exposed.

Figure 5E:
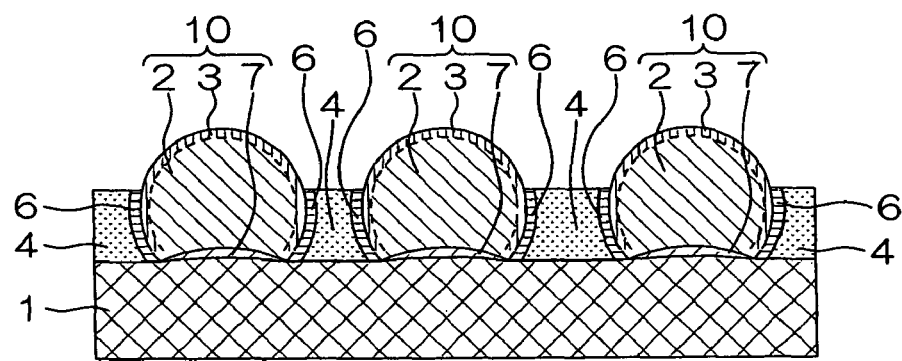

Subsequently, as shown in FIG. 5e, the upper part of protective film 6 is removed to allow the upper part of the semiconductor particle 10 to be exposed.

To remove the upper part of the protective film 6, the exposed protective film 6 is etched by using hydrofluoric acid or the like. In this case, since the insulator 4 covers the lower part of the protective film 6, it also serves as a mask. Therefore, manufacturing of the photovoltaic conversion device can be simplified.

This allows the upper part of the semiconductor particle 10 to be exposed. The semiconductor particle 10 can form the connection area S connected to the upper electrode 5.

The connection area S can be formed by forming the protective film 6 on the surface of the semiconductor particle 10 and partially removing the surface of the upper hemisphere of the semiconductor particle 10 by etching or the like. Alternatively, the connection area S can be formed by previously forming a resist at the region considered as the connection area S of the semiconductor particle 10, forming the protective film 6 and then removing the resist. Preferably, in particular, after forming the protective film 6 on the surface of the semiconductor particle 10, a part of the surface of the upper hemisphere of the semiconductor 10 is removed by etching or the like to form the connection area S. According to this method, it is easy to control the surface area of the connection area S.

Figure 5F:
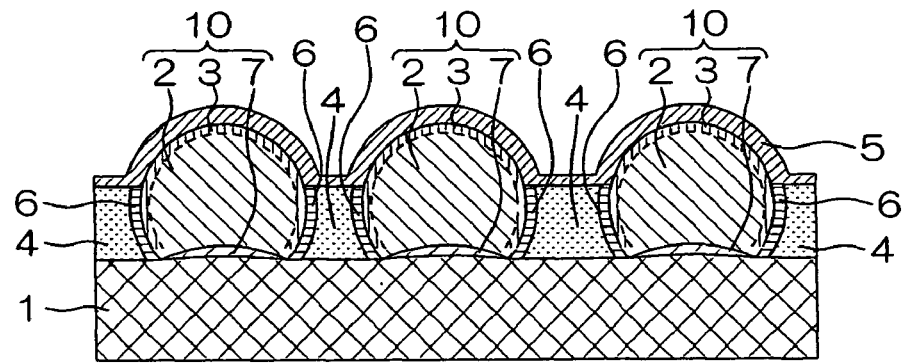

Subsequently, as shown in FIG. 5f, the upper electrode 5 is formed on the surface of the exposed upper part (connection area S) of the semiconductor particle 10 and the surface on the insulator 4.

The upper electrode 5 is formed by using the dipping method, the spin coat method, the spray method, the screen printing method or the like.

The photovoltaic conversion device shown in FIGS. 1a and 1b can be obtained according to the above-mentioned process.

Next, a manufacturing method of the photovoltaic conversion device shown in FIGS. 2a and 2b will be described with reference to FIGS. 6a to 6h.

FIGS. 6a to 6h are sectional views each showing the process of the manufacturing method of this photovoltaic conversion device.

Figure 6A:
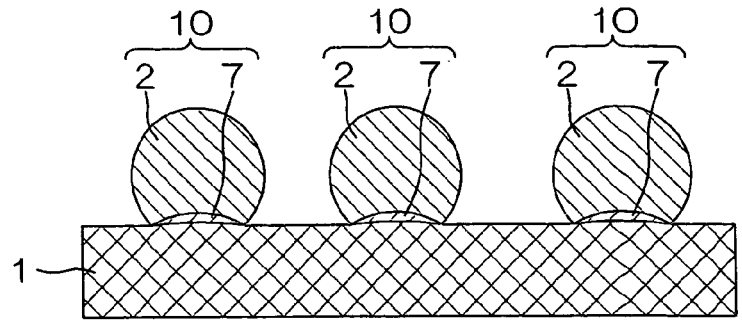
FIGS. 6a to 6h are sectional views each showing a process of a manufacturing method of the photovoltaic conversion device shown in FIGS. 2a and 2b.
Figure 6B:
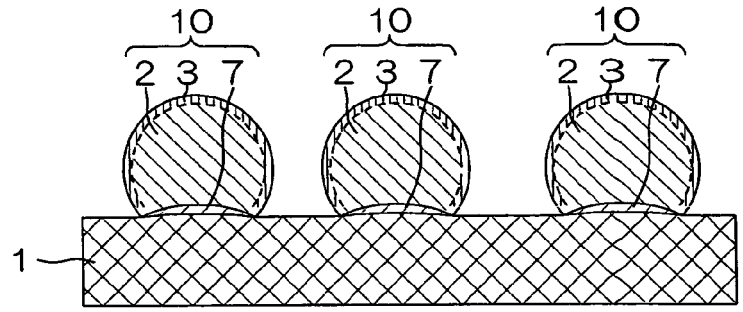

Firstly, a lot of one conduction-type semiconductor parts 2 forming the semiconductor particles 10 are prepared. Subsequently, a lot of one conduction-type semiconductor parts 2 are joined to the substrate 1 (FIG. 6a). Subsequently, the semiconductor particle 10 is formed by forming the other conduction-type semiconductor layer 3 on the surface of the one conduction-type semiconductor part 2 (FIG. 6b).

Figure 6C:
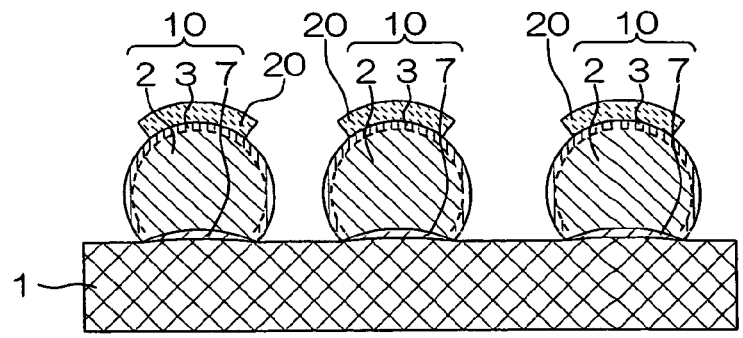

Then, a resist 20 is formed on a part of the surface of the upper hemisphere of the semiconductor particle 10 (FIG. 6c).

The resist 20 is formed of acid-proof polyimide and the like. The resist 20 is formed by using the screen printing method, the transfer method, the rolling method or the like. Preferably, the resist 20 has a thickness of 10 μm to 40 μm.

Figure 6D:
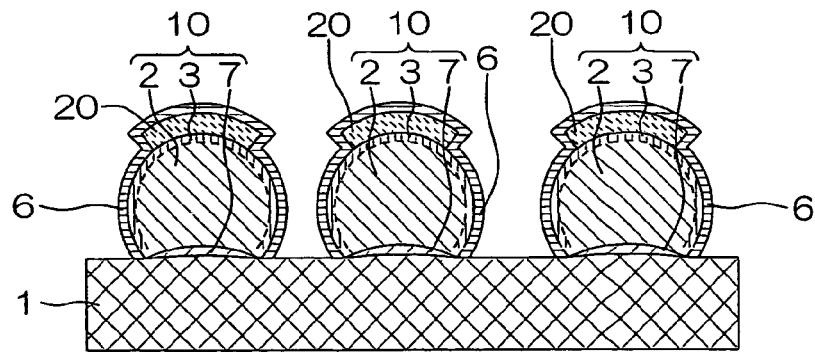
Figure 6E:
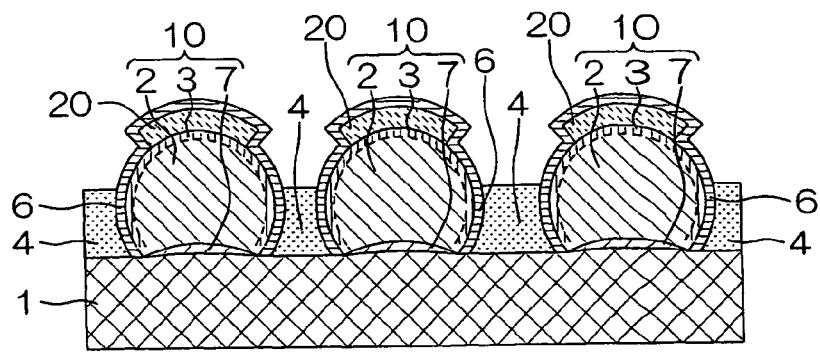
Figure 6F:
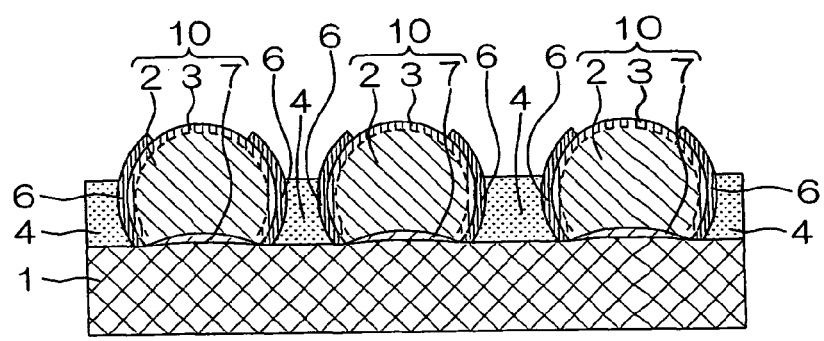
Figure 6G:
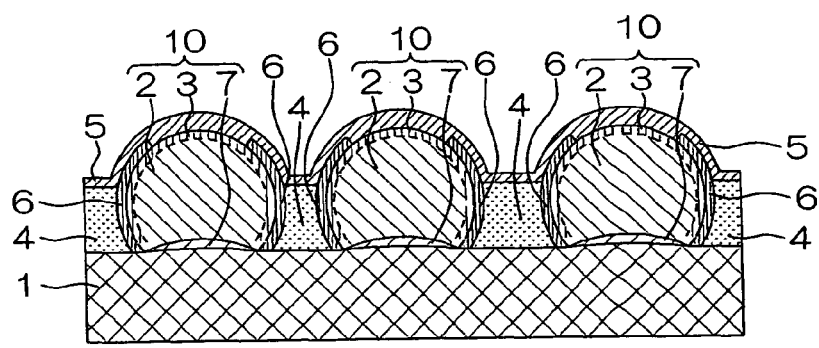
Figure 6H:
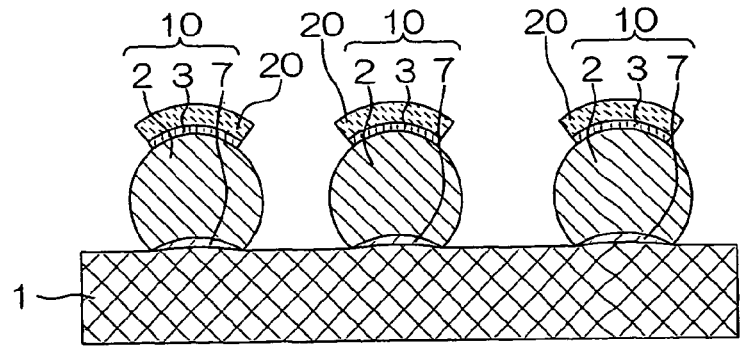

Following the step of forming the resist 20, the surface of the semiconductor particle 10 except the junction and the portion where the resist 20 is formed may be etched (FIG. 6h).

The other conduction-type semiconductor layer 3 is electrically separated from the substrate 1 by such etching and the carrier C generated in the other conduction-type semiconductor layer 3 can be moved to the upper electrode 5 without being transferred to the substrate 1. For this reason, a leak current flowing from the other conduction-type semiconductor layer 3 to the substrate 1 can be suppressed.

A short circuit between the upper electrode 5 and the substrate 1 may occur through the pn junction on the surface of the semiconductor particle 10 except the junction and the area where the resist 20 is formed.

However, by further etching the surface in this way, the other conduction-type semiconductor layer 3 in the connection area S is removed, thereby to remove the pn junction in the area. Therefore, a short circuit between the upper electrode 5 and the substrate 1 can be prevented. Thus, the photovoltaic conversion device with high photovoltaic conversion efficiency can be manufactured.

Subsequently, the protective film 6 is formed on the surface of the semiconductor particle 10 except the junction (FIG. 6d). In this case, especially, the forming method according to the thermal oxidation method is preferred. In this manufacturing method, as shown in FIG. 6d, carrier gas is hard to reach some places. For this reason, when the protective film 6 is formed according to the thin film manufacturing method, there are some cases where it becomes difficult to form a thin film, leading to ununiformity of the protective film 6 thus obtained. However, according to the thermal oxidation method, the uniform protective film 6 can be formed even with respect to the complicated shape of the semiconductor particle 10 on which the resist 20 is formed.

In this case, the protective film 6 is formed on the whole of the semiconductor particle 10 including the surface of the resist 20.

Subsequently, the insulator 4 is formed in the lower part between the adjoining semiconductor particles 10 (FIG. 6e).

Subsequently, the resist 20 is removed to allow a part of the surface of the upper hemisphere of the semiconductor particle 10 to be exposed (FIG. 6f). The resist 20 is removed by using a known etching solution, polishing or the like. The surface of the upper hemisphere of the semiconductor particle 10 is made to be exposed by removing the resist 20. Thus, the connection area S connected to the upper electrode 5 can be formed on the semiconductor particle 10. That is, the protective film 6 exists above the formation region of the insulator 4 and the upper electrode 5 is formed also on the surface of the upper part of the protective film 6.

Subsequently, the upper electrode 5 is formed on the surface of the exposed upper part (connection area S) of the semiconductor particle 10, the surface of the upper hemisphere of the protective film 6 and the surface of the insulator 4 (FIG. 6g).

According to the above-mentioned manufacturing method of photovoltaic conversion device, the photovoltaic conversion device shown in FIGS. 2a and 2b can be obtained.

According to the manufacturing method of the photovoltaic conversion device, the protective film 6 is formed also on the surface of the semiconductor particle 10 other than the surface of the connection area S. Therefore, the photovoltaic conversion device with high photovoltaic conversion efficiency can be manufactured easily.

Further, an optical power generator so configured as to use the photovoltaic conversion device thus obtained as a power generation means and supply electric power generated by the power generating means to a load can be obtained.

That is, one or more the photovoltaic conversion devices are connected to each other (in series, in parallel or in series parallel in the case of two or more) and the connected photovoltaic conversion devices are used as the power generating means. Generated power is directly supplied from the power generating means to a direct-current load. Alternatively, after transforming generated power into suitable AC power through a power conversion means such as an inverter, the optical generating means may be used as a power generating device that supplies the generated power to a commercial power system and the AC load of various kinds of electric appliances. Moreover, the power generating device can be installed in a sunny building and used as an optical power generator such as solar energy power generation system of various modes.

Since the photovoltaic conversion device with high photovoltaic conversion efficiency is used in the optical power generator, optical power generation with high photovoltaic conversion efficiency can be performed.

Next, another embodiment of the photovoltaic conversion device shown in FIGS. 1a and 1b, and FIGS. 2a and 2b will be described with reference to FIGS. 3 and 4.

Figure 3:
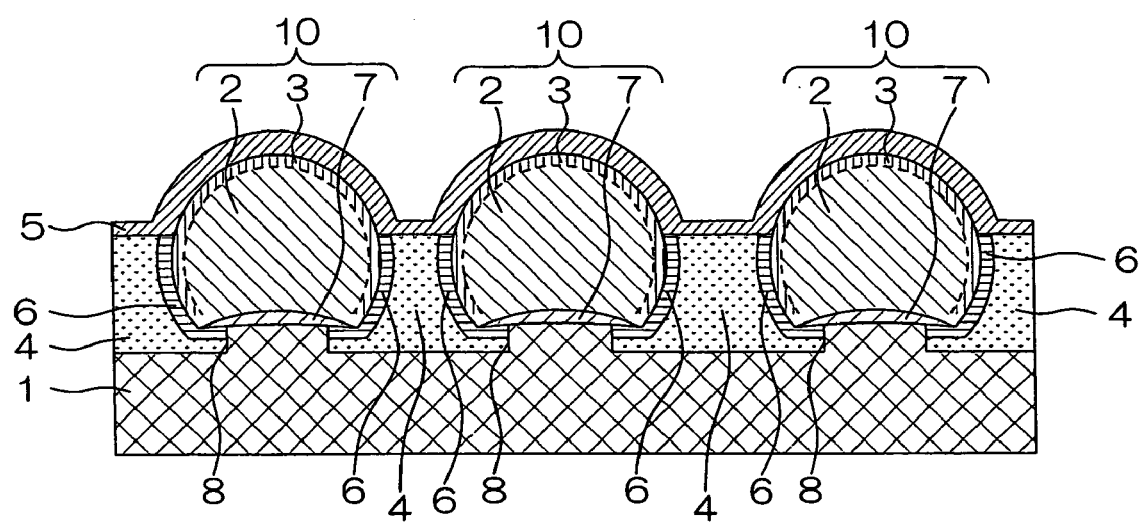
FIG. 3 is an expanded sectional view showing another embodiment of the photovoltaic conversion device shown in FIGS. 1a and 1b.
Figure 4:
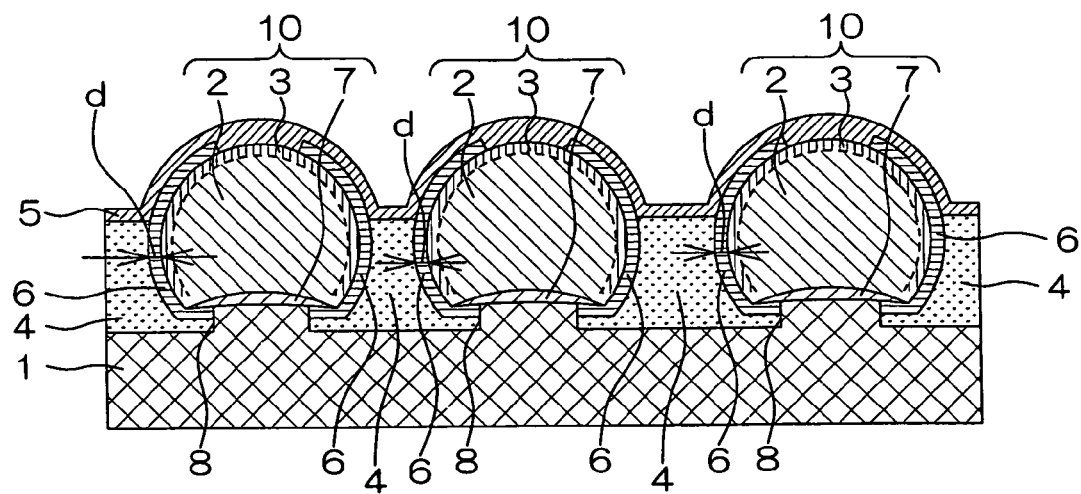
FIG. 4 is an expanded sectional view showing another embodiment of the photovoltaic conversion device shown in FIGS. 2a and 2b.

As shown in FIGS. 3 and 4, the lower end of the other conduction-type semiconductor layer 3 is covered with the protective film 6. That is, a step 8 is formed on the junction of the semiconductor particle 10 with respect to the base face of the substrate 1.

To form the step 8, according to the manufacturing method of the photovoltaic conversion device shown in FIGS. 1a and 2a, a lot of the semiconductor particles 10 are joined to the substrate 1 (refer to FIG. 5b and FIG. 6b), and then, the periphery of the junction of the substrate 1 is removed by selective etching using photoresist and the like.

Since the step 8 is formed on the junction of the semiconductor particle 10 in this manner, the lower end of the other conduction-type semiconductor layer 3 is electrically separated from the substrate 1. For this reason, the carrier C generated in the other conduction-type semiconductor layer 3 can be moved to the upper electrode 5 certainly without being transferred to the substrate 1. Therefore, the leak current flowing from the other conduction-type semiconductor layer 3 to the substrate 1 can be suppressed.

EXAMPLE 1

An example of the photovoltaic conversion device of the present invention will be described with reference to FIG. 3 and FIGS. 5a to 5f.

Firstly, a p-type semiconductor part formed of p-type silicon which has an average particle diameter of 700 μm and contains boron of $1\times10^{16}$ atoms/cm$^3$ was prepared. Subsequently, the surface of this p-type semiconductor part was washed, and then heat-treated at the temperatures of 850° C. to 980° C. in a gaseous phase containing POCl$_3$. Thereby, an n-type semiconductor layer having the dopant concentration of $5\times10^{19}$ atoms/cm$^3$ to $3\times10^{20}$ atoms/cm$^3$ and the depth in the pn junction of 0.5 μm to 1.5 μm was formed on the surface of the p-type semiconductor part.

Next, this was etched. Nitric acid and hydrofluoric acid were mixed at the volume ratio of 50:1. The mixed solution was used as an etchant solution. The p-type semiconductor part was immersed into the etchant solution for 1 to 3 minutes for etching. By this etching, the dopant concentration of the n-type semiconductor part was set to $3\times10^{18}$ atoms/cm$^3$.

In this manner, the semiconductor particle in which the n-type semiconductor layer was formed on the surface of the p-type semiconductor part was formed (FIG. 5a).

Next, the semiconductor particles were densely arranged in one layer on a substrate formed of aluminum and heated at temperatures not lower than 577° C. (eutectic crystal temperature of aluminum and silicon) to join the semiconductor particles to the substrate. By heating and welding the substrate and the semiconductor particle, a junction where the semiconductor particle is joined to the substrate is formed. Thus, aluminum was spread in high concentration to form a high-concentration semiconductor layer. The n-type semiconductor layer disappeared at this junction.

Thereby, the semiconductor particle in which the carrier C generated in the pn junction can take out from the substrate 1 was produced (FIG. 5b).

Next, the periphery of the junction of the substrate was removed by using hydrochloric acid to form a step. This separated the n-type semiconductor layer from the substrate (refer to FIG. 3).

Next, a heating furnace was prepared. Subsequently, the carrier gas consisting of oxygen was passed through a pure water tank heated up to 90° C. Thereby, oxygen and steam depending on partial pressure in the tank were supplied to the heating furnace. In this state, the substrate was heated at temperatures of 500° C. to 577° C. for thermal oxidation.

Thus, a protective film formed of an oxide film was formed on the surface of the semiconductor particle except the junction (FIG. 5c).

At this time, by varying heating temperature and heating time, the average value of thickness d of the protective film was varied in the range of 0.7 nm to 150 nm (sample No. 1-sample No. 9).

Then, heat treatment was performed in a nitrogen atmosphere containing hydrogen of 5 volume % at temperatures of 300° C. to 500° C. This resulted in the protective film containing hydrogen.

Next, an insulator formed of polyimide resin as an acid-proof material was formed to be filled in the lower part between the adjoining semiconductor particles. At this time, the protective film located on the surface of the upper hemisphere of the semiconductor particle was exposed (FIG. 5d).

Next, the exposed protective film was removed by using hydrofluoric acid (FIG. 5e).

Next, the substrate from which the protective film was removed was thrown into a DC sputtering system using ITO as a target. Then, an upper electrode formed of ITO was formed on the surface of the upper hemisphere of the semiconductor particle and the surface of the insulator (FIG. 5f). The thickness of the upper electrode was set at 100 nm. In this manner, the photovoltaic conversion device was produced.

In addition, a photovoltaic conversion device was produced according to the same process as in this example 1 except that following joint of the semiconductor particle to the substrate, the insulator is formed without forming the protective film and then the upper electrode is formed (sample No. 10).

The photovoltaic conversion efficiency of these photovoltaic conversion devices was measured. The result was in Table 1.

TABLE 1

| Sample No. | Thickness (Protective film) (nm) | Photovoltaic conversion efficiency (%) |
|---|---|---|
| 1 | 0.7 | 10.5 |
| 2 | 0.9 | 11.0 |
| 3 | 1 | 12.3 |
| 4 | 10 | 13.5 |
| 5 | 50 | 13.2 |
| 6 | 100 | 12.4 |
| 7 | 101 | 12.1 |
| 8 | 110 | 12.0 |
| 9 | 150 | 11.8 |
| 10 | 0* | 10.3 |

*No protective film

As shown in Table 1, when the protective film was not formed, the photovoltaic conversion efficiency was as low as 10.3%. The photoelectric conversion efficiency rose from 10.5% to 13.5% as the thickness d of the protective film became larger from 0.7 nm to 10 nm. When thickness d of the protective film exceeded 10 nm, the photovoltaic conversion efficiency became lower gradually, and in the case of 150 nm, the photovoltaic conversion efficiency was 11.8%.

When there was no protective film, the effect of suppressing recombination of the carrier C on the surface of the semiconductor particle could not be acquired. For this reason, it can be assumed that the photovoltaic conversion efficiency became low. When the protective film was as thin as 1 nm or less, since the protective film was formed on the surface of the semiconductor particle in the shape of an island, an uncovered place of the protective film occurred. For this reason, it can be assumed that recombination of the carrier C could not fully be suppressed. When thickness d of the protective film exceeded 100 nm, since the protective film absorbed light, the light led to the pn junction of the semiconductor particle decreased. For this reason, it can be assumed that the photovoltaic conversion efficiency fell.

As described above, high photovoltaic conversion efficiency could be acquired by forming the protective film to suppress recombination of the carrier C. Especially when the thickness d of the protective film was 1 nm to 100 nm, high photovoltaic conversion efficiency could be acquired.

Since the n-type semiconductor layer was separated from the substrate by the step, a short circuit between the n-type semiconductor layer and the substrate could be prevented.

EXAMPLE 2

In the step of forming the insulator in the example 1, the amount supplied of the insulator formed of polyimide resin was changed (FIG. 5d). Thereby, in the photovoltaic conversion device, the surface area of the connection area S of the semiconductor particle was changed. Specifically, the ratio E of the surface area of the connection area S was changed from 3% to 80% as shown in Table 2 (sample No. 1 to sample No. 9).

In addition, a photovoltaic conversion device was produced by forming the upper electrode without removing the protective film and by performing the same process as in the example 1 (sample No. 10). That is, in this photovoltaic conversion device, the ratio E of the surface area of the connection area S was 0%.

The photovoltaic conversion efficiency of these photovoltaic conversion devices was measured. The result was shown in Table 2.

TABLE 2

| Sample No. | Ratio E of surface area of connection area S (%) | Photovoltaic conversion efficiency (%) |
| --- | --- | --- |
| 1 | 3 | 6.0 |
| 2 | 4 | 11.5 |
| 3 | 5 | 12.6 |
| 4 | 15 | 12.9 |
| 5 | 50 | 13.5 |
| 6 | 70 | 13.1 |
| 7 | 71 | 12.3 |
| 8 | 75 | 12.1 |
| 9 | 80 | 11.9 |
| 10 | 0* | 2.2 |

*No exposure

As shown in Table 2, when there was no connection area S (the ratio E of the surface area of the connection area S: 0%), the photovoltaic conversion efficiency was as low as 2.2% and the photovoltaic conversion efficiency was increased from 6.0% to 13.5% as the ratio E of the surface area of the connection area S was increased from 3% to 50%. When the ratio E of the surface area of the connection area S exceeded 50%, the photovoltaic conversion decreased slightly, and when the ratio E of the surface area of the connection area S was 80%, the photovoltaic conversion efficiency was 11.9%.

When there was no connection area S, the carrier C generated in the semiconductor particle flowed toward the upper electrode by tunnel junction. For this reason, the resistance in the movement path from the semiconductor particle to the upper electrode was large. It can be assumed that since the resistance of the generated carrier C became larger, the photovoltaic conversion efficiency became lower.

When the ratio E of the surface area of the connection area S was less than 5%, since the movement path L where the carrier C generated at a place distant from the connection area S moved to the upper electrode 5 became longer, resistance of the generated carrier C became large. In the connection area S, resistance became larger due to concentration of the carrier C (refer to FIG. 2b). Therefore, the photovoltaic conversion efficiency fell. Further, since the productive film was formed on the upper part of the semiconductor particle with large surface area, incident light was reflected or absorbed on the area, thereby to reduce the amount of light led to the pn junction of the semiconductor particle. Therefore, it can be assumed that the photovoltaic conversion efficiency fell.

When the ratio E of the surface area of the connection area S exceeded 70%, since the surface area of the connection area S became smaller, the effect of suppressing recombination of carrier C by the protective film was weakened. Therefore, it is surmised that the photovoltaic conversion efficiency fell.

As described above, it turned out that high photovoltaic conversion efficiency could be acquired when the ratio E of the surface area of the connection area S was 5% to 70%. Further, a short circuit between the n-type semiconductor layer and the substrate could be prevented certainly by having separated the n-type semiconductor layer from the substrate by the step.

EXAMPLE 3

Next, an example 3 will be described with reference to FIGS. 4 and FIGS. 6a to 6h.

In this example 3, a photovoltaic conversion device was produced according to the same process as in the example 1 except the below-mentioned steps.

Firstly, the p-type semiconductor part having the average particle diameter of 400 μm was prepared. As in the example 1, this p-type semiconductor part was joined to the substrate and then the n-type semiconductor layer was formed on the surface of the p-type semiconductor part. In this manner, the semiconductor particle in which the n-type semiconductor layer was formed on the surface of the p-type semiconductor part was formed (FIGS. 6a and 6b).

Subsequently, an acid-proof resist was formed in the upper part of the upper hemisphere of the semiconductor particle by using the roll transfer method. Then, this was dried in an oven (FIG. 6c).

Subsequently, this was immersed into the mixed solution of hydrofluoric acid and nitric acid to remove the n-type semiconductor layer except the acid-proof resist-forming part on the surface of the semiconductor particle (FIG. 6h). Subsequently, this was washed and dried. Next, the protective film formed of silicon nitride was formed on the surface of the semiconductor particle and the surface of the resist according to the plasma CVD method as a thin film manufacturing method (Refer to FIG. 6d). The thickness d of this protective film was 70 nm. Then, the protective film was heated in a nitrogen atmosphere containing hydrogen of 5 volume % at temperatures of 300° C.to 500° C. Thereby, the protective film contained hydrogen.

Subsequently, the insulator was formed in the same manner as in the example 1 (refer to FIG. 6e). Then, the resist was removed (refer to FIG. 6f). Next, the upper electrode was formed in the same manner as in the example 1 (refer to FIG. 6g). In this manner, the photovoltaic conversion device was produced. The photovoltaic conversion efficiency of the produced photovoltaic conversion device was measured. As a result, this photovoltaic conversion efficiency was 13.2%.

Thus, it turns out that the photovoltaic conversion device of this example has high photovoltaic conversion efficiency.

Recombination of the carrier C could be suppressed by the protective film. The substrate was certainly separated from the n-type semiconductor layer, thereby to prevent a short circuit.

EXAMPLE 4

In the step of forming the protective film of an example 4, the protective film formed of silicon oxide was formed by using the thermal oxidation method as in the example 1. Subsequently, this protective film was not heated in a nitrogen atmosphere containing hydrogen of 5 volume %. The photovoltaic conversion device was produced according to the same process as in the example 3 except the above-mentioned heat treatment. The photovoltaic conversion efficiency of the produced photovoltaic conversion device was measured. As a result, this photovoltaic conversion efficiency was 12.8%.

Thus, it turns out that the photovoltaic conversion device of the example 4 has high photovoltaic conversion efficiency.

Recombination of the carrier C could be suppressed by the protective film. The substrate was certainly separated from the n-type semiconductor layer, thereby to prevent a short circuit.

In the example 3, the protective film formed of silicon nitride and produced according to the plasma CVD method contained hydrogen of 10 percent by mass. On the other hand, in the example 4, the protective film formed of silicon oxide and produced according to the thermal oxidation method contained hydrogen of 1 percent by mass.

According to the plasma CVD method in the example 3, when the protective film formed of silicon nitride was formed, much hydrogen was contained in silicon during formation of the protective film. On the other hand, according to the thermal oxidation method in the example 4, when the protective film formed of silicon oxide was formed, less hydrogen was contained in the protective film. Therefore, in the example 3, it can be assumed that dangling bonds (uncombined hands) on the surface of the semiconductor particle were terminated. Therefore, the photovoltaic conversion efficiency of the photovoltaic conversion device of the example 4 was slightly lower than that of the example 3.

As apparent from the examples 1 to 4, according to the photovoltaic conversion device of the present invention, high photovoltaic conversion efficiency can be acquired.

The photovoltaic conversion device of the present invention is not limited to an above-mentioned embodiment and various modifications and improvements can be added without deviating from contents of the invention.

The disclosure of Japanese patent application Serial No.2004-129888, filed on Apr. 26, 2004, is incorporated herein by reference.

The invention claimed is:

1. A photovoltaic conversion device comprising:
a substrate used as a lower electrode;
a plurality of semiconductor particles joined to the substrate;
an insulator formed in a lower part between the adjoining semiconductor particles on the substrate;
a protective film comprised of an oxide, nitride, or oxynitride of the semiconductor constituting the semiconductor particle, which is directly formed on the surface of the semiconductor particle except at least a part of the surface thereof; and
an upper electrode formed on a surface of the insulator and on an area of the part of the surface of the semiconductor particle on which the protective film is not formed, the area being a connection area with the upper electrode and the semiconductor particle, wherein the upper electrode is formed on a surface of the protective film which is formed on the surface of the semiconductor particle, wherein a portion of the protective film extends above the insulator.

2. A photovoltaic conversion device as stated in claim 1, wherein the protective film exists above a formation region of the insulator on the surface of the semiconductor film, and
the upper electrode is formed also on the surface of the upper part of the protective film.

3. A photovoltaic conversion device as stated in claim 1, Wherein the semiconductor particle has a one conduction-type semiconductor part joined to the substrate and an other conduction-type semiconductor layer formed on the surface of the one conduction-type semiconductor part, and a lower end of the other conduction-type semiconductor layer is coated with the protective film.

4. A photovoltaic conversion device as stated in claim 1, wherein the substrate is formed of silver, aluminum or copper.

5. A photovoltaic conversion device as stated in claim 1, wherein the substrate contains an impurity element which is incorporated from the one conduction-type semiconductor joined to the substrate.

6. A photovoltaic conversion device as stated in claim 1, wherein the semiconductor particle has a rough surface.

7. A photovoltaic conversion device as stated in claim 1, wherein a high-concentration semiconductor layer containing an impurity element which imparts one conduction type to the semiconductor joined to the substrate in higher concentration than the one formed in the bulk of the semiconductor particle.

8. A photovoltaic conversion device as stated in claim 1, wherein an average value of the thickness of the protective film is 1 nm to 100 nm.

9. A photovoltaic conversion device as stated in claim 1, wherein the protective film contains hydrogen.

10. A photovoltaic conversion device as stated in claim 1, wherein a ratio of the connection area to the surface area of the semiconductor particle except the junction where the semiconductor particle is joined to the substrate is 5% to 70%.

11. An optical power generator so configured as to use the photovoltaic conversion device stated in claim 1 as a power generating means which supplies generated electric power to a load.

12. A photovoltaic conversion device comprising:
a lower electrode;
a plurality of semiconductor particles joined to the lower electrode;
a protective film comprised of an oxide, nitride, or oxynitride of the semiconductor constituting the semiconductor particle, wherein the protective film is formed on the surface of the semiconductor particle except at least a part of the surface thereof;
an insulator formed in a lower part of a space between the adjoining semiconductor particles having the protective film thereon; and
an upper electrode formed on the part of the surface of the semiconductor particle on which the protective film is not formed, wherein the insulator and the upper electrode are formed on a surface of the protective film which is formed on the surface of the semiconductor particle, wherein a portion of the protective film extends above the insulator.

13. A photovoltaic conversion device as stated in claim 12, wherein the protective film exists above a formation region of the insulator on the surface of the semiconductor film, and the upper electrode is formed also on the surface of the upper part of the protective film.

14. A photovoltaic conversion device as stated in claim 12, wherein the semiconductor particle has a one conduction-type semiconductor part joined to the lower electrode and an other conduction-type semiconductor layer formed on the surface of the one conduction-type semiconductor part, and a lower end of the other conduction-type semiconductor layer is coated with the protective film.

15. A photovoltaic conversion device as stated in claim 12, wherein the lower electrode is formed of silver, aluminum or copper.

16. A photovoltaic conversion device as stated in claim 12, wherein the lower electrode contains an impurity element which is incorporated from the one conduction-type semiconductor joined to the lower electrode.

17. A photovoltaic conversion device as stated in claim 12, wherein the semiconductor particle has a rough surface.

18. A photovoltaic conversion device as stated in claim 12, wherein a high-concentration semiconductor layer containing an impurity element which imparts one conduction type to the semiconductor joined to the lower electrode in higher concentration than the one formed in the bulk of the semiconductor particle.

19. A photovoltaic conversion device as stated in claim 12, wherein an average value of the thickness of the protective film is 1 nm to 100 nm.

20. A photovoltaic conversion device as stated in claim 12, wherein the protective film contains hydrogen.

21. A photovoltaic conversion device as stated in claim 12, wherein a ratio of the connection area to the surface area of the semiconductor particle except the junction where the semiconductor particle is joined to the lower electrode is 5% to 70%.

22. An optical power generator so configured as to use the photovoltaic conversion device stated in claim 12 as a power generating means which supplies generated electric power to a load.

* * * * *